United States Patent
Staedtler et al.

(10) Patent No.: US 10,491,141 B2
(45) Date of Patent: Nov. 26, 2019

(54) PHASE-CHOPPING CONTROL OF PIEZOELECTRIC ACTUATORS

(71) Applicant: VERMES MICRODISPENSING GMBH, Otterfing (DE)

(72) Inventors: Juergen Staedtler, Feldkirchen-Westerham (DE); Mario Fliess, Munich (DE); Jiri Karger, Munich (DE)

(73) Assignee: VERMES MICRODISPENSING GMBH, Otterfing (DE)

( * ) Notice: Subject to any disclaimer, the term of this patent is extended or adjusted under 35 U.S.C. 154(b) by 423 days.

(21) Appl. No.: 15/320,603

(22) PCT Filed: Jun. 1, 2015

(86) PCT No.: PCT/EP2015/062129
§ 371 (c)(1),
(2) Date: Dec. 20, 2016

(87) PCT Pub. No.: WO2016/008633
PCT Pub. Date: Jan. 21, 2016

(65) Prior Publication Data
US 2018/0219495 A1   Aug. 2, 2018

(30) Foreign Application Priority Data
Jul. 16, 2014 (DE) .................. 10 2014 110 003

(51) Int. Cl.
*H02N 2/06* (2006.01)
*F16K 31/00* (2006.01)

(52) U.S. Cl.
CPC ........... *H02N 2/067* (2013.01); *F16K 31/004* (2013.01)

(58) Field of Classification Search
None
See application file for complete search history.

(56) References Cited

U.S. PATENT DOCUMENTS

2002/0101253 A1* 8/2002 Pletner ................. F16F 15/005
                                                               324/727
2006/0267523 A1* 11/2006 Seelig ..................... H02J 5/005
                                                                318/16
(Continued)

FOREIGN PATENT DOCUMENTS

CN       101323048 A      12/2008
CN       101802470 A       8/2010
(Continued)

OTHER PUBLICATIONS

English Translation of JP 2007202262, Osamu (Year: 2007).*
(Continued)

*Primary Examiner* — Bryan P Gordon
(74) *Attorney, Agent, or Firm* — Studebaker & Brackett PC

(57) ABSTRACT

The invention describes a piezo driving circuit, comprising an input at which a temporally variable voltage signal is applied; a piezo interface for connecting terminals of a piezo actuator arrangement with at least one voltage controlled piezo actuator; a sync control circuit realized to detect the phase position of the voltage signal; and an inverter circuit between the input and the piezo interface; whereby the sync control circuit is realized to control the inverter circuit, based on the phase position of the voltage signal, such that a control voltage with a predefined voltage curve is applied at the piezo interface. The invention further describes a method of controlling a piezo actuator arrangement. The invention also describes a piezo actuator configuration comprising a piezo actuator arrangement and an inventive piezo driving circuit. The invention also describes a metering valve comprising the inventive piezo actuator configuration.

15 Claims, 3 Drawing Sheets

(56) References Cited

U.S. PATENT DOCUMENTS

| | | | | |
|---|---|---|---|---|
| 2009/0309454 | A1* | 12/2009 | Ladra | H02N 2/06 310/317 |
| 2010/0066204 | A1 | 3/2010 | Hayashi et al. | |
| 2010/0296184 | A1* | 11/2010 | Shibatani | G02B 7/005 359/824 |
| 2012/0313682 | A1 | 12/2012 | Sprentall et al. | |
| 2015/0091960 | A1* | 4/2015 | Nakazawa | B41J 2/04541 347/10 |

FOREIGN PATENT DOCUMENTS

| | | |
|---|---|---|
| CN | 103609022 A | 2/2014 |
| DE | 296 03 924 U1 | 4/1996 |
| DE | 10 2006 031 079 A1 | 1/2008 |
| JP | 2007-202262 A | 8/2007 |
| TW | 522293 B | 3/2003 |
| WO | 2004/066481 A2 | 8/2004 |
| WO | 2008/056435 A1 | 5/2008 |
| WO | 2012/170857 A1 | 12/2012 |
| WO | 2013/187871 A1 | 12/2013 |

OTHER PUBLICATIONS

An Office Action mailed by the Japanese Patent Office dated Nov. 6, 2018, which corresponds to Japanese Patent Application No. 2017-502597 and is related to U.S. Appl. No. 15/320,603.

The Second Office Action mailed by the State Intellectual Property Office of the People's Republic of China on Aug. 27, 2018, which corresponds to Chinese Patent Application No. 2015800284167 and is related to U.S. Appl. No. 15/320,603.

The First Office Action issued by the Chinese Patent Office dated Dec. 5, 2017, which corresponds to Chinese Patent Application No. 2015800284167 and is related to U.S. Appl. No. 15/320,603; with English translation.

An Office Action and the Office Action search issued by the Taiwanese Patent Office dated Nov. 26, 2018, which corresponds to Taiwanese Patent Application No. 104121409 and is related to U.S. Appl. No. 15/320,603.

International Search Report issued in PCT/EP2015/062129; dated Jul. 29, 2015.

An Office Action issued by the State Intellectual Property Office dated Mar. 28, 2019, which corresponds to Chinese Patent Application No. 201580028416.7 and is related to U.S. Appl. No. 15/320,603.

* cited by examiner

PHASE-CHOPPING CONTROL OF PIEZOELECTRIC ACTUATORS

The invention described a piezo driving circuit and a method of driving a piezo actuator arrangement.

Piezo actuators are used to control mechanical motion in many fields of technology, particularly in manufacturing technology. In order to control a mechanical motion, a certain voltage is applied to a piezo actuator and the inverse piezo effect results in a mechanical motion, namely a contraction or extension of the piezo actuator to be more precise. Because of the mechanical motion, the piezo actuator in turn moves an actuating element such as a plunger or a lever. A piezo actuator comprises at least a piezo element or a group of piezo elements that are connected together in series or in parallel. Series-connected piezo elements can be implemented as piezo stacks, whereby the travel of a piezo stack is correspondingly longer than that of a single piezo element.

As an example, metering valves that use a plunger driven by an actuator such as a piezo actuator are used in the application and metering of thin or pasty materials, particularly in the application of adhesives. The piezo actuator is driven by the voltage of a control signal applied to the piezo actuator, and performs a mechanical motion with which the valve plunger is actuated. The extent to which the metering valve is opened can be controlled by the level of the piezo actuator's control voltage. The amount of material that is dispensed depends on the duration in which the valve is open. The duration in which the valve is open depends on the frequency of the control voltage.

Usually, the signal from which the piezo actuator control signal is derived is generated using oscillators of dedicated waveform generators. Straightforward waveform generators with analogue switching circuitry implement a configurable saw-tooth oscillator, for which the triangular waveform is brought into a roughly sinusoidal shape using a non-linear circuit. The sinusoidal outputs of these devices generally exhibit a relatively large distortion factor. A square wave is generated from the triangular wave by means of a comparator, whereby the pulse width of the square wave can be set by adjusting a reference voltage. However, the precision of this type of waveform generator is very limited. Digital waveform generators use direct digital synthesis (DDS) and can generate different periodic waveforms. The accuracy is significantly higher compared to devices using analogue switching technology, and depends primarily on the internal resolution in the DDS. A quartz oscillator generally serves as clock source for the DDS clock. These types of voltage source offer a high degree of accuracy, but, since they are designed for a broad range of application, they are generally complex in construction and very expensive.

It is therefore an object of the invention to provide an economical and sufficiently exact drive circuit for piezo actuators, and a corresponding method of driving piezo actuators.

The object is achieved by the piezo driving circuit of claim 1, by the method of claim 11, by the piezo actuator configuration of claim 14, and by the metering valve of claim 15.

The piezo driving circuit according to the invention comprises an input at which a temporally variable voltage signal is provided. The voltage signal at the input can originate from a standard power supply, for example a 50 Hz or 60 Hz mains supply. The piezo driving circuit further comprises a piezo interface for connection to a piezo actuator arrangement of at least one voltage-controlled piezo actuator. A piezo actuator arrangement comprises at least one piezo actuator, but equally a plurality of piezo actuators can be parallel-connected in a piezo actuator arrangement, or the piezo actuator arrangement can be divided into individual groups of piezo actuators that are connected in parallel. The interface can for example comprise terminals with which the piezo actuator, the piezo actuators, or the piezo actuator arrangement can be electrically connected to the piezo driving circuit. Furthermore, the piezo driving circuit comprises a sync control circuit realized to detect the phase position of the voltage signal, and an inverter circuit between the input and the piezo interface. The inverter circuit can be a rectifier circuit, for example, with which an AC voltage is fragmented and re-assembled to give a DC voltage. The sync control circuit may be regarded as a kind of sequential control. The sync control circuit is realized to control the inverter circuit in such a way that a control voltage with a predefined voltage waveform is applied at the piezo interface, depending on the phase position of the voltage signal. In other words, the sync control circuit determines the temporal behaviour of the voltage signal and fragments and re-assembles the voltage signal on the basis of this information, to create a signal with a voltage waveform that has a predefined shape and frequency. With this signal, for example, the precise metering of thin or pasty substances is made possible with the aid of metering valves that are controlled by piezo actuators. Sufficient control accuracy favourably does away with the need for a costlier AC voltage source such as a waveform generator. A particular advantage that can be achieved by the invention lies in that a standard voltage signal obtained from an AC supply such as a standard power supply can be used as input signal, and portions of the standard voltage waveform are cut out of the standard voltage signal and re-assembled to arrive at a waveform with the desired shape and frequency.

In the inventive method of controlling a piezo actuator arrangement, a voltage signal is received, and waveform portions of the voltage signal are fragmented and re-assembled by reversing the polarity of the voltage signal according to a predefined switching scheme. The polarity-reversed voltage signal is applied as control signal at a piezo interface to connect terminals of a piezo actuator arrangement with at least one voltage-controlled piezo actuator.

The inventive piezo actuator configuration comprises a piezo driving circuit with the features according to the invention, and a piezo actuator arrangement.

The inventive metering valve comprise a piezo actuator configuration with the features according to the invention.

Further particularly advantageous embodiments and realizations of the invention derive from the dependent claims and the following description.

In an advantageous embodiment of the inventive piezo driving circuit, the inverter circuit comprises a switching matrix with a plurality of lines arranged in rows, a plurality of lines arranged in columns, and a plurality of switches arranged at the line intersections of the switch matrix, each of which connects a row line with a column line. To control the switches, the switches are connected with a control signal to the sync control circuit. For example, the switches could be connected to the sync control circuit by means of separate parallel lines allocated to the individual switches. Alternatively, the switches can be controlled by means of a switch matrix.

In particularly preferred embodiment of the invention, the piezo driving circuit comprises a discharge switch connected in parallel to the piezo interface. The discharge switch serves to pull the voltage between the piezo terminals to ground asynchronously, i.e. independently of the signal frequency determined by the input voltage, or at least to achieve a reduction in the voltage at the piezo terminals. Using the discharge switch, the frequency and the shape of the control signal can be formed in a particularly flexible manner and largely independent of the input voltage.

According to an alternative embodiment of the inventive piezo driving circuit, the discharge switch comprises a resistor when through-connected. The switching behaviour or discharging time in which charge is transferred from the piezo actuators by the discharge switch is determined by the electrical resistance of the discharge switch and the capacitance of the piezo actuator. Alternatively, an additional resistor can be connected in series with the discharge switch, to determine the switching behaviour or charge transfer time of the piezo actuators together with the resistor and the capacitance of the piezo actuator.

In a further preferred embodiment of the invention, the piezo driving circuit comprises a further switch that is connected in series between the discharge switch and the piezo interface, and which is connected in parallel with a bridging resistor. Discontinuities in the voltage waveform can be remedied by means of the additional switch. In other words, the bridging resistor introduces an additional time constant which can influence the development of the voltage waveform of the control signal. In its open state, the additional switch presents infinite resistance, and the current flows through the parallel-connected resistor. When closed, i.e. through-connected, the switch presents practically zero resistance, and the current flows essentially through the switch.

The voltage signal used by the inventive piezo driving circuit can be an AC signal or a three-phase electric power signal. With the three-phase signal, even though the base frequency is the same, higher signal frequencies of the control signal can be achieved compared to AC signal, since—put simply—it is possible to jump back and forth between the individual phases of the polyphase signal.

In a particularly advantageous embodiment of the piezo driving circuit, a plurality of piezo actuators are connected in parallel. With this circuit configuration, for example, a parallel assemble line can be realised with a single driver circuit. Being able to dispense with additional drive switches results not only in a reduction in costs, but also in an exactly synchronous operation of the parallel controlled units.

Furthermore, the piezo actuators can be arranged in a plurality of groups of piezo actuators, whereby each group is allocated two lines of the switching matrix in column direction. The sync control circuit can be realized to generate a separate control signal for each of the groups of piezo actuators, so that the individual groups pf piezo actuators can be controlled independently of each other. In this way, different driving patterns can be realised at the same time with a single driving circuit. For example, several different manufacturing steps can be controlled with a single driving circuit.

The piezo driving circuit can further comprise a voltage source connected to the input. Here, an isolating transformer can be connected between the voltage supply and the inverter circuit. The isolation transformer reliably prevents a ground short circuit of the power supply, which might for example inadvertently be caused by a user. In this way, safety is increased in operation and maintenance of the arrangement.

In a particularly advantageous embodiment of the inventive method, the voltage signal for controlling the piezo actuators can be modified by discharging the voltage-controlled piezo actuators through an additional discharge switch, connected in parallel to the piezo interface.

The voltage signal for controlling the piezo actuators can also be modified by connecting a serial resistor.

In a particularly advantageous embodiment of the inventive method, the switches are driven chronologically synchronous to the zero-crossing of the voltage signal, to achieve a currentless switching of the switches. This manner of driving results in a particularly low energy consumption of the driving circuit.

Alternatively, control of the switches can be temporally offset from the zero-crossing of the voltage signal, so that the polarity of the voltage applied to the piezo interface can vary. By varying the polarity of the voltage applied to the piezo actuators, it is effectively possible to achieve a longer displacement or travel of the piezo actuators. In this case, care is preferably taken to ensure that the negative or "bipolar" voltage applied to the piezo actuators does not exceed a certain value of the operating voltage, and that the duration of applying the bipolar voltage to the piezo actuators does not exceed a maximum value.

The invention will be explained in detail in the following with reference to the accompanying drawings and with the aid of exemplary embodiments. In the diagrams, identical or similar objects are given the same reference numbers.

Figure 1:
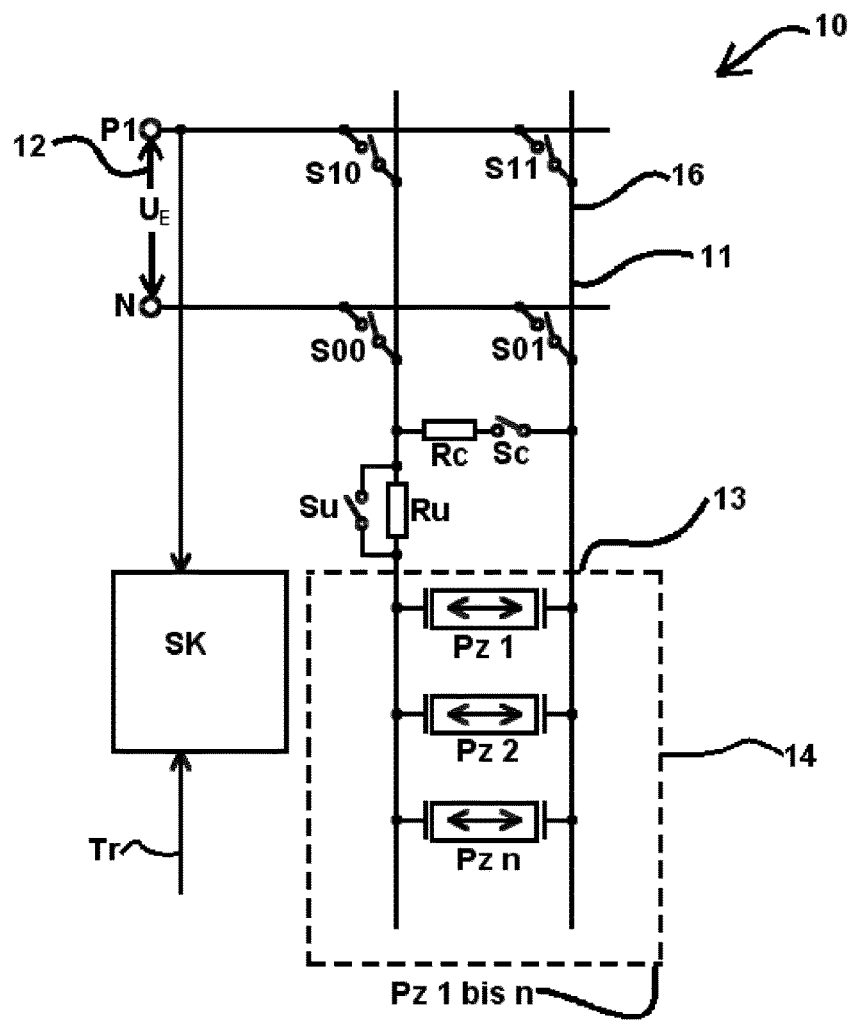
FIG. 1 shows a piezo driving circuit according to a first embodiment of the invention.

FIG. 1 shows a piezo actuator setup 10 with a piezo driving circuit 11 according to a first embodiment of the invention. In this exemplary embodiment, a piezo actuator arrangement PZA of piezo actuators Pz 1, Pz 2 . . . Pz n is driven. The piezo driving circuit 11 comprises an input 12 across which a temporally variable voltage $U_E$ is applied. The temporally variable voltage $U_E$ can be generated for example by an AC voltage source (not shown). In the simplest case, this AC voltage source can be a standard AC power supply. The input comprises a phase input P1 and an input for a neutral conductor N. The phase P1 at the phase input in this case is for instance a phase conductor of a power supply. The piezo driving circuit 11 further comprises an inverter circuit 16 with a 2×2 switching matrix of four electronic switches S10, S11, S00, S01 that is connected as a matrix with the input 12 as well as with a piezo interface 13. The piezo interface 13 in turn is connected to a piezo actuator arrangement 14 with a plurality of parallel-connected piezo actuators Pz 1, Pz 2 . . . Pz n. The parallel arrangement of the piezo actuators Pz 1, Pz 2 . . . Pz n permits a particularly simple and economical way of controlling the piezo actuators and constructing the piezo driving circuit 11, because only a single control unit or piezo driving circuit 11 is needed for a large number of piezo actuators. The phase of the voltage $U_E$ applied at the input 12 is determined by a sync controller SK, and appropriate control signals for the electronic switches S10, S11, S00, S01 are generated at trigger signal Tr applied to the sync controller SK according to a switching scheme in order to create a specific voltage shape at the piezo actuators or the piezo actuator arrangement 14.

To transfer control signals to the switches S, the sync control circuit SK can be connected to the switches S by means of individual connectors allocated to the individual switches S. Alternatively, a switching matrix is also possible, by means of which the switches S are controlled by the sync control circuit SK. For the sake of clarity, such connectors are not shown in FIG. 1. Polarity-true control of the piezo actuators Pz 1, Pz 2 . . . Pz n and energy recovery are achieved by the periodic change in control of the electronic switches S10, S11, S00, S01 according to the phase position of the input voltage $U_E$. in this exemplary embodiment, switching of the electronic switches occurs continually with respect to the voltage curve, so that currentless switching is made possible. Currentless switching has the added effect that the piezo actuators behave as reactance and therefore consume practically no electrical energy. The energy required to charge the piezo actuators from the power supply is fed back into the power supply during discharging. In addition, a switch Sc is connected in parallel to the piezo actuators Pz 1, Pz 2 . . . Pz n or the piezo actuator arrangement 14. Switch Sc can be used for an asynchronous discharge of the piezo actuators Pz 1, Pz 2 . . . Pz n. Asynchronous discharging is to be understood to mean a discharging that is not synchronous to the input voltage $U_E$. Switch Sc comprises a resistor Rc, shown as the resistor serially connected to switch Sc. When switch Sc is open, i.e. not through-connected, the voltage applied to the piezo actuators Pz 1, Pz 2 . . . Pz n is controlled according to the input voltage $U_E$. When switch Sc is closed, i.e. through-connected, an equalizing current flows through the terminals of the piezo actuators Pz 1, Pz 2 . . . Pz n and brings the voltage between the terminals of the piezo actuators back to zero. Switch Sc can therefore be used to determine an arbitrary time interval for the activation of the piezo actuators. Furthermore, a switch Su with parallel bridging resistor Ru is arranged between the switch Sc or resistor Rc and the piezo actuators Pz 1, Pz 2 . . . Pz n. Switch Su serves to overcome possible discontinuities in the generation of voltage shapes and, together with switch Sc, contributes a further time constant.

Figure 2:
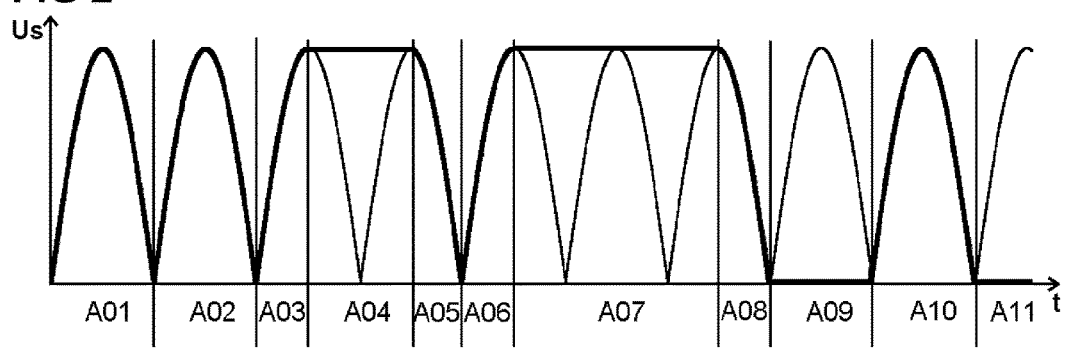
FIG. 2 shows a plot of voltage over time for a control voltage applied to a piezo actuator arrangement.

FIG. 2 shows a voltage waveform of a control voltage $U_s$ applied at a piezo actuator arrangement 14 or the piezo actuators of a piezo actuator arrangement 14 according to the first embodiment. The behaviour of the control voltage $U_s$ over time is achieved solely by the switching on and off of the switches S00, S01, S10, S11. The corresponding switching scheme is shown in Table 1. The "open" switch state is indicated by "0", and the "closed" switch state is indicated by "1". In the time interval or section A01, both of the switches S00, S11 are open, and switches S01, S10 are closed. In other words, the voltage of the positive half-wave at P1 is seen by the piezo actuators of the piezo actuator arrangement 14 such that a positive potential is applied via switch S10 to the left-hand terminals of the piezo actuators, i.e. to the terminals connected to switches S00, S10, whereas the potential of the neutral conductor, ideally the zero potential, is applied via switch S01 to the right-hand terminals of the piezo actuators, i.e. to the terminals connected to switches S01, S11. In all, a positive voltage is applied to the piezo actuators Pz 1, Pz 2, . . . Pz n during the time interval A01. The length of time during which the piezo actuators are actuated is determined in this case by the frequency of the voltage $U_E$ applied at the input 12 (see FIG. 1).

TABLE 1

| Section | S00 | S01 | S10 | S11 |
|---------|-----|-----|-----|-----|
| A01     | 0   | 1   | 1   | 0   |
| A02     | 1   | 0   | 0   | 1   |
| A03     | 0   | 1   | 1   | 0   |
| A04     | 0   | 0   | 0   | 0   |
| A05     | 1   | 0   | 0   | 1   |
| A06     | 0   | 1   | 1   | 0   |
| A07     | 0   | 0   | 0   | 0   |
| A08     | 0   | 1   | 1   | 0   |
| A09     | 0   | 0   | 0   | 0   |
| A10     | 0   | 1   | 1   | 0   |
| A11     | 0   | 0   | 0   | 0   |

In the case of a standard power supply with a frequency of 50 Hz, for example, the length of time interval A01 will be 10 ms. The signal $U_E$ applied during the time interval A01 can be regarded as one pulse of a 100 Hz series of half-waves. During time interval A02, the input voltage $U_E$ is polarity-reversed and a negative voltage is present at P1. In order to ensure that the piezo actuators Pz 1, Pz 2, . . . Pz n continue to be driven with the correct polarity, the input voltage $U_E$ is inverted by closing switches S00, S11 and opening switches S01, S10. This ensures that the same voltage waveform is seen by the piezo actuator during time interval A02 as was seen during time interval A01. In other words, during time interval A02, the potential of the neutral conductor, ideally the zero potential, is applied via switch S01 to the left-hand terminals of the piezo actuators, i.e. to the terminals connected to switches S00, S10, whereas the voltage of the phase P1, i.e. a negative potential, is applied to the right-hand terminals of the piezo actuators, i.e. to the terminals connected to switches S01, S11. In all, a positive voltage is also applied to the piezo actuators Pz 1, Pz 2, . . . Pz n during the time interval A02. The toggling of the switches S00, S01, S10 and S11 is synchronized by the sync controller SK mentioned above with the phase behaviour of the input voltage $U_E$. This can be realized, for example, in that the phase P1 is detected by the sync controller at the input, and the generation of the switching signals at switches S00, S01, S10 and S11 by the sync controller SK is triggered by this phase signal. An arrow in the direction of the sync controller SK is shown between phase P1 and the sync controller SK. This arrow indicated that the voltage of phase P1 is detected by the sync controller SK. For example, a lead can be arranged between phase P1 and the sync controller SK to allow detection of the voltage signal at phase P1. Time interval A03 corresponds to a half of time interval A01. In time interval A04, all switches S00, S01, S10 and S11 are opened so that the voltage $U_s$ applied to the piezo actuators is held for the duration of time interval A04. Opening of switches S00, S01, S10 and S11 can be triggered for example by a trigger signal Tr received by the sync controller from a control arrangement (not shown). The sync controller SK then synchronizes it switching behaviour with the phase of the input voltage $U_E$ once again, and releases the switches S00, S01, S10 and S11 in phase, i.e. precisely then, when the input signal has reached a maximum. The piezo actuators Pz 1, Pz 2, . . . Pz n remain actuated during interval A04, i.e. a voltage $U_s$ is applied across the terminals of the piezo actuators. At the beginning of time interval A01, switches S01 and S11 are closed, so that the voltage $U_s$ applied to the piezo actuators Pz 1, Pz 2, . . . Pz n returns to 0, according to the inverted input voltage $U_E$, during the remainder of the time interval. In time intervals A03 to A05, two half-waves are effectively joined to create a signal pulse which has half the frequency or twice the period of the signals in intervals A01 and A02. The procedure of intervals A03 to A05 is repeated during intervals A06 to A08, with the difference that a longer actuation interval of the piezo actuators Pz 1, Pz 2, . . . Pz n is maintained, with a pulse duration or period that is three times as long as that of time intervals A01 and A02. In the time interval A01, switches S00, S01, S10 and S11 are opened, while the voltage $U_s$ applied to the piezo actuators is 0V. During this time, the piezo actuators Pz 1, Pz 2, . . . Pz n are de-activated. During interval A10, an activation of the piezo actuators Pz 1, Pz 2, . . . Pz n follows, with another break in interval A11 in the same manner as in interval A09.

Figure 3:
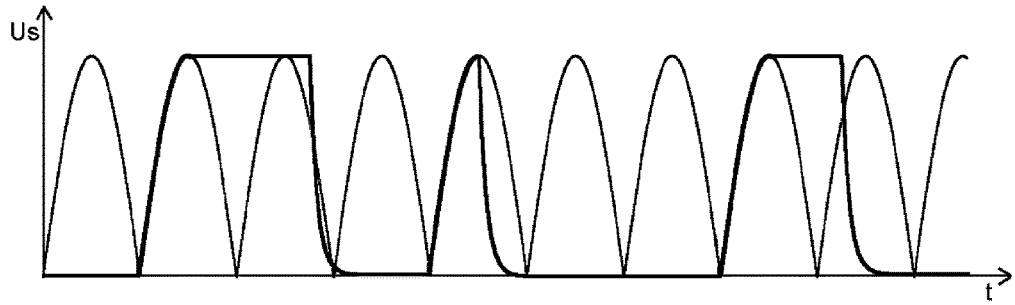
FIG. 3 shows a plot of voltage over time for a control voltage applied to a piezo actuator arrangement.

FIG. 3 shows a voltage waveform of a control voltage $U_s$ applied at a piezo actuator arrangement 14 or the piezo actuators of a piezo actuator arrangement 14 according to the first embodiment, wherein the voltage $U_s$ applied at a piezo actuators Pz 1, Pz 2, . . . Pz n is modified by means of a chopper switch Sc. The use of this additional switch Sc allows free choice of when the piezo actuators Pz 1, Pz 2, . . . Pz n are discharged. In this way, a metering pulse can be generated after charging and at a point in time that is independent of the grid frequency. For example, during the third half-wave of the input voltage $U_E$ the chopper switch is activated so that the voltage $U_s$ applied to the piezo actuators Pz 1, Pz 2, . . . Pz n returns to zero at about the time that the fourth half-wave commences. As explained in FIG. 3, use of the switch Sc in conjunction with the other switches S00 to S11 can shorten or lengthen the period of the signal voltage or control voltage $U_s$.

Figure 4:
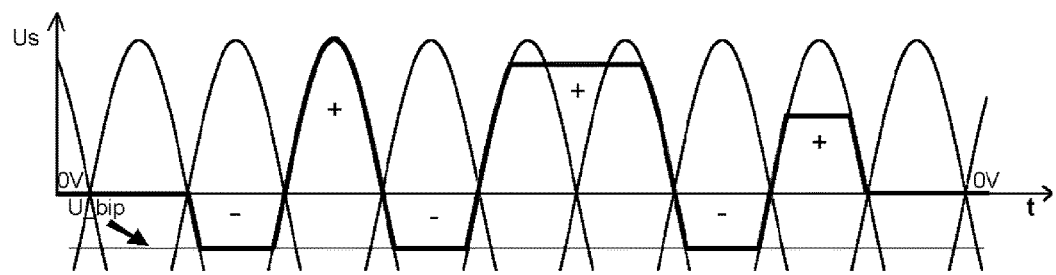
FIG. 4 shows a bipolar plot of a voltage over time for a control voltage applied to a piezo actuator arrangement.

FIG. 4 shows the progression of a voltage waveform that can be applied in order to achieve a particularly long stroke or travel of the piezo actuators Pz 1, Pz 2, . . . Pz n. The travel of the piezo actuators is dependent on the voltage differences between the extremes of the control signal $U_s$. The travel of the piezo actuators Pz 1, Pz 2, . . . Pz n is increased by polarity-reversing the piezo actuators. The negative voltage $U_s$ that is temporarily applied to the piezo actuators Pz 1, Pz 2, . . . Pz n is also referred to as the bipolar voltage $U_{bip}$. The bipolar voltage $U_{bip}$ arises by offsetting the actuation times of switches S00, S01, S10 and S11. In the example shown in FIG. 4, in contrast to the examples shown in FIGS. 2 and 3, switches S01 and S10 are closed or remain closed during the second half-wave, i.e. during a negative input voltage $U_E$ or negative phase P1, i.e. the negative voltage $U_E$ at the input is transferred to the interface 13 between the piezo driving circuit 11 and the piezo actuator arrangement 14 with piezo actuators Pz 1, Pz 2, . . . Pz, so that initially there is no rectification and polarity-reversal of the piezo actuators Pz 1, Pz 2, . . . Pz n is achieved. Expressed differently, the negative potential of the negative half-wave of phase P1 is applied at the left-hand terminals of the piezo actuators Pz 1, Pz 2, . . . Pz n. A negative voltage is therefore applied to the piezo actuators, which should be applied only briefly in order to avoid damaging the piezo actuators, and which should be limited to about one quarter of the operating voltage. During the second half-wave in FIG. 4, after the instant at which the value of the input voltage $U_E$ e has reached a predefined threshold value, the voltage at the piezo actuators Pz 1, Pz 2, . . . Pz n is held constant by opening switches S01 and S10. This state persists until the value of the input voltage $U_E$ or its absolute value is once again lower than the threshold value. Subsequently, switches S01 and S10 are closed so that the input voltage $U_E$ is once again applied to the piezo actuators Pz 1, Pz 2, . . . Pz n.

Figure 5:
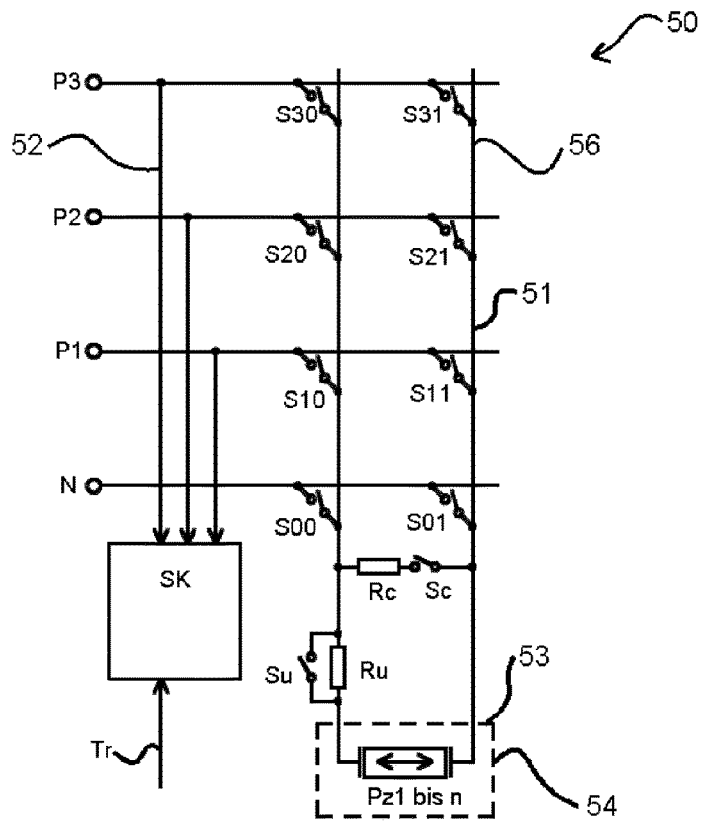
FIG. 5 shows a piezo driving circuit according to a second embodiment of the invention.

FIG. 5 shows a piezo actuator configuration 50 with a piezo driving circuit 51 according to a second embodiment of the invention. The piezo actuator configuration 50 comprises an input 52 analogously to the piezo actuator configuration 10. In this case, control of the piezo actuators Pz 1, Pz 2, . . . Pz n is extended to three phases. The input voltage $U_E$ is applied as a three-phase voltage. The variety of waveforms that can be created is increased compared to the first embodiment, as is the frequency with which the switching states of the piezo actuators can be changed. On the other hand, a control signal having the same frequency as in the first embodiment can be generated from a ⅔ lower frequency. Because of the fact that signal jitter noise is proportional to the base frequency, this noise can accordingly be reduced by ⅔ in the second embodiment. The piezo actuator configuration 50 is constructed analogously to the piezo actuator configuration 10 of FIG. 1. In contrast to FIG. 1, the input of the piezo actuator configuration 50 comprises three phases P1, P2 and P3, which are coupled over an inverter circuit 56 having a 4×2 switching matrix with switches S00, S01, S10, S11, S20, S21, S30, S31 and by means of a piezo interface 53 to a piezo actuator arrangement 54 comprising a plurality of parallel-connected piezo actuators Pz 1 to Pz n. The sync controller SK is coupled to the phases P1, P2 and P3 in order to detect all three phases of the input voltage $U_E$. The sync controller SK now controls switches S00, S01, S10, S11, S20, S21, S30, S31 of the 4×2 switching matrix synchronously to the three-phase input voltage $U_E$, so that a positive voltage $U_s$ with the desired shape and temporal development is applied to each of the piezo actuators Pz 1 to Pz n. In the same way as in the first embodiment, the voltage $U_s$ applied to the piezo actuators Pz 1 to Pz n can be adjusted by means of a chopper switch Sc. The use of this additional switch Sc allows free choice of when the piezo actuators Pz 1, Pz 2, . . . Pz n are discharged. As mentioned already, this makes it possible to generate a metering pulse after charging at a point in time that is independent of the grid frequency.

Figure 6:
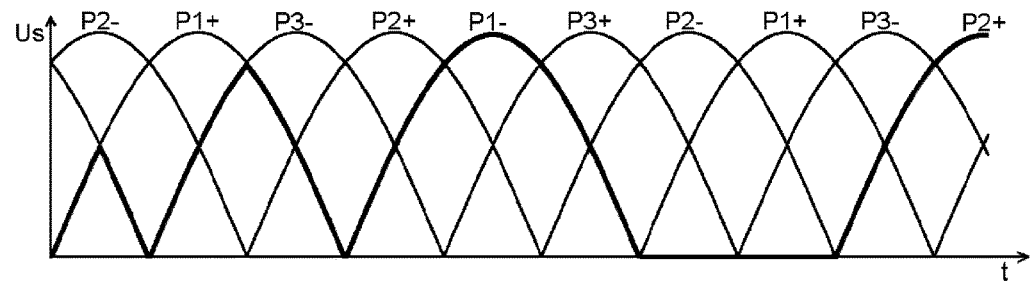
FIG. 6 shows a plot of voltage over time for a control voltage applied to a piezo actuator arrangement and generated by the piezo driving circuit according to a second embodiment of the invention.

FIG. 6 shows a voltage waveform of the control voltage $U_s$, generated by a piezo driving circuit 51 according to the second embodiment. In this example, the waveform commences with the closure of switches S10 and S01 while all other switches are opened. When the phase of P1 is 30°, the absolute values of the voltages of phases P1 and P3 are equal, resulting in a jump to phase P3 by opening switch S10 and closing switch S30. The voltage of phase P3 is positive, so that a positive voltage continues to be applied to the piezo actuators Pz 1 to Pz n. At the transition from the positive half-wave to the negative half-wave of phase P3 at the input, switches S31 and S00 are closed, and switches S01 and S30 are opened, so that a positive voltage continues to be applied to the piezo actuators Pz 1 to Pz n. When the phase of P1 is 120°, the absolute values of the voltages of phases P1 and P3 are equal, resulting in a jump back to phase P1 by opening switches S31 and S00, and closing switches S10 and S01. During the negative half-wave of phase P1, switches S10 and S01 are opened, and switches S11 and S00 are closed, so that a positive voltage continues to be applied to the piezo actuators Pz 1 to Pz n. At the transition from the negative half-wave to the positive half-wave of phase P1, all switches S31 and S00 are opened, so that the voltage $U_s$ applied to the piezo actuators Pz 1 to Pz n stays at null. The voltage waveform is continued on the second phase P2 by closing the two switches S20 and S01, and keeping the remaining switches open. By jumping between the individual phases at different intersections of the phases, it is possible to achieve different signal waveforms with different pulse lengths and amplitudes.

Figure 7:
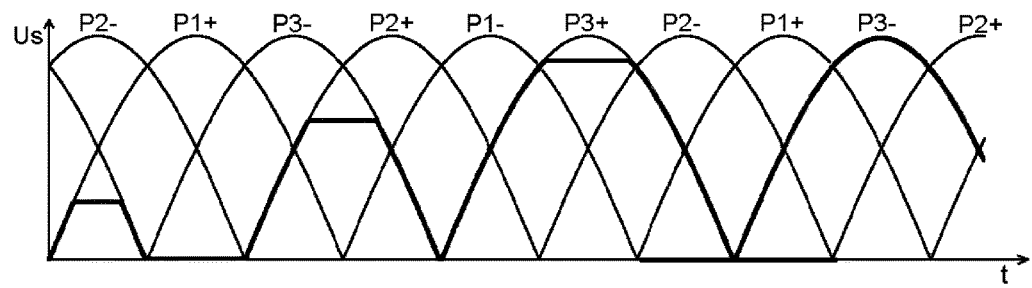
FIG. 7 shows a plot of voltage over time for a control voltage applied to a piezo actuator arrangement and generated by the piezo driving circuit according to a second embodiment of the invention.

FIG. 7 shows a voltage waveform against time for a control voltage $U_s$ that can also be generated by a piezo driving circuit 51 according to the second embodiment. The amplitudes of the voltages $U_s$ applied to the piezo actuators Pz 1 to Pz n are scaled to certain voltage values. Scaling is done by clamping the voltages $U_s$ applied to the piezo actuators Pz 1 to Pz n at specific levels. This is achieved by opening the switch S that is closed, i.e. through-connected, at a threshold value of the voltage amplitude or at a certain value of the corresponding input voltage phase. The control voltage $U_s$ is first generated by through-connecting switches S10 and S01, while all other switches are open. When the phase of P1 is at about 15°, switches S10 and S01 are opened, so that the voltage level that has just been reached then remains constant. When the phase of P1 is at about 45°, a changeover is effected to the positive half-wave of P3, and switch S30 and switch S01 are through-connected. At the zero-crossing of phase P3, switches S30 and S01 are opened, so that the piezo actuators now remain inactive. Subsequently, a changeover to the positive half-wave of P2 is effected, by through-connecting switches S20 and S01. At a predefined threshold value of the control voltage $U_s$, switches S20 and S01 are opened again, so that the threshold value of the control voltage is clamped until the absolute value of the voltage of phase P3 is equal to the threshold value of the control voltage $U_s$. At this point, a changeover to the negative half-wave of phase P3 is effected by through-connecting switches S31 and S00. At the zero-crossing of phase P3 or the changeover to the positive half-wave, the control voltage $U_s$ is kept positive by opening switches S31 and S00 and closing switches S30 and S01 instead. At a predefined threshold value of the control voltage $U_s$, switches S30 and S01 are opened so that the threshold value is kept as control voltage, until the input voltage $U_E$ once again reaches the predefined threshold level. At this point, a changeover back to the positive half-wave of phase P3 s effected by through-connecting switches S30 and S01 again. At the zero-crossing of the voltage $U_s$, i.e. at the transition to the negative half-wave of phase P3, switches S30 and S01 are opened and switches S31 and S00 are through-connected, which has the result that the negative voltage $U_E$ at the input is inverted to a positive control voltage $U_s$ at the piezo actuators.

Figure 8:
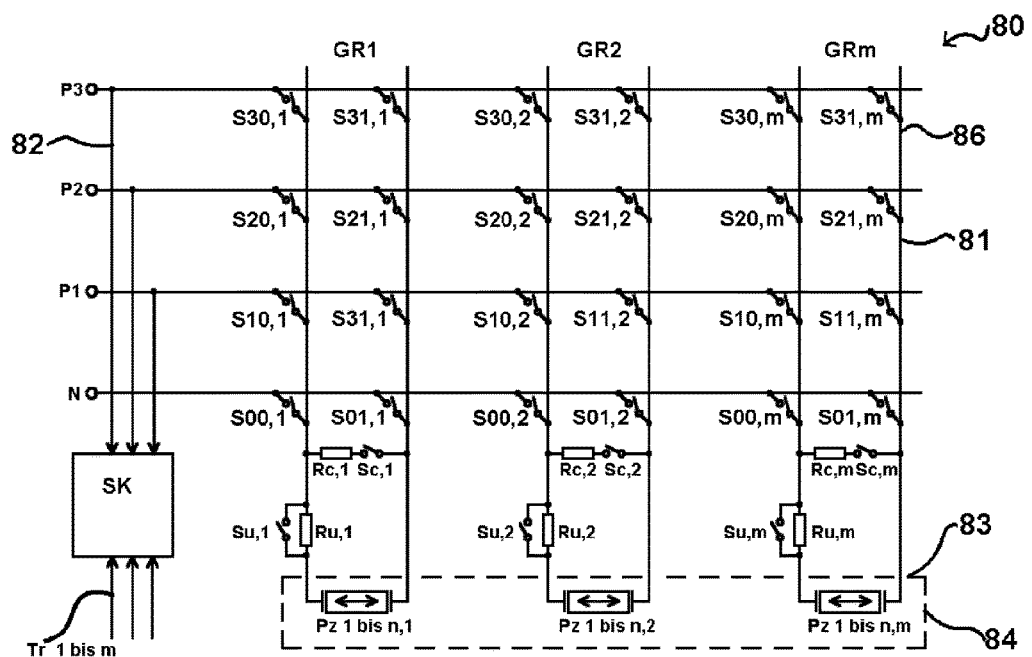
FIG. 8 shows a piezo driving circuit according to a third embodiment of the invention.

FIG. 8 shows a piezo actuator configuration 80 according to a third embodiment of the invention. The piezo actuator configuration 80 also comprises a piezo driving circuit 81 and a piezo actuator arrangement 84, coupled together by a piezo interface 83. Furthermore, the piezo driving circuit 81 comprises an input 82 at which an input signal $U_E$ is applied. The converter circuit 86 of configuration 80 according to the third embodiment is a further development of the configuration 50 according to the second embodiment in that a further 2m−2 columns have been added to the switching matrix of the second embodiment, in order to be able to control m valve groups GR1 to GRm independently of each other. To independently control the switch groups i of the individual groups GR1 to GRm, which switch groups i comprise switches S00,i, S01,i, S10,i, S11,i, S20,i, S21,i, S30,i, S31,i, for i=1 to m, independent trigger signals Tr1 to m are issued to the sync controller SK. Depending on the time instant of the trigger signals, the individual groups of piezo actuators Pz 1,i to Pz n,i for which i=1 to m are driven at different times. For example, the execution of different and temporally offset job steps with different metering arrangements is conceivable, or the synchronous execution of different job steps in different groups of metering valves, requiring only a single piezo driving circuit 81. Analogously to the configurations in FIG. 1 and FIG. 5, the piezo actuator configuration 80 of FIG. 8 comprises a parallel switch Sc,i and a serial switch Su,i for which i=1 to m for each of the valve groups.

To avoid disruptions or accidents, it can be expedient to connect an isolating transformer between the input of the driving circuits 11, 51, 81 described above and the voltage source. Galvanic isolation between the piezo actuator and the power supply prevents the flow of large currents should a user come into contact with the piezo actuators while these are connected to a voltage source or power supply. If the power source is a polyphase or three-phase voltage, it is expedient to choose a transformer which is constructed with a delta connection for the primary winding and a star connection for the secondary winding. This type of connection creates a neutral conductor on the secondary side, i.e. the voltages on the neutral conductor always sum to 0, so that its full load capacity is ensured.

To obtain a variable control voltage, an additional regulating transformer can follow the isolating transformer, whereby three regulating transformers coupled on one axis may be incorporated for the embodiment that uses a three-phase input.

If input voltage frequencies are required that are higher than the available frequencies of 50 Hz or 60 Hz for example, an additional inverter can precede the driver circuit described above, with which the desired voltage frequency is generated independently of the grid frequency.

Finally, it shall be pointed out that the piezo actuator configurations and piezo actuator arrangements described in detail above are simply exemplary embodiments which can be modified by the skilled person in any number of ways without leaving the scope of the invention. Use of the indefinite article "a" or "an" does not exclude the possibility of multiple instances of the relevant feature.

REFERENCE SIGNS 10, 50, 80 piezo actuator configuration
11, 51, 81 piezo driving circuit
12, 52, 82 input
13, 53, 83 piezo interface
14, 54, 84 piezo actuator arrangement
16, 56, 86 inverter circuit
A01 . . . A11 time interval
GR1 . . . GRm group of piezo elements
N neutral conductor
P1, P2, P3 phase
Pz 1, Pz 2 . . . Pz n piezo element
Pz 1 . . . Pz n,i piezo element of the i-th valve group
Rc resistor
Ru bridging resistor
S, S10, S11, S00, S01, S20, S21, S30, S31 electronic switch
S00,i, S01,i, S10,i, S11,i, S20,i, S21,i, S30,i, S31,i electronic switch of the i-th switch group
Sc switch/chopper switch
SK sync controller
Su serial switch
Tr, Tr1 . . . Trm trigger signal
$U_{bip}$ bipolar voltage
$U_E$ input voltage
$U_s$ control voltage/voltage applied to the piezo elements

The invention claimed is:

1. A piezo driving circuit (11, 51, 81), comprising
an input (12) at which a temporally variable voltage signal ($U_E$) is applied;
a piezo interface (13, 53, 83) for connecting terminals of a piezo actuator arrangement (14, 54, 84) with at least one voltage controlled piezo actuator (Pz);
a sync control circuit (SK) that detects the phase position of the voltage signal ($U_E$); and
an inverter circuit (16, 56, 86) between the input (12) and the piezo interface (13, 53, 83),
whereby the sync control circuit (SK) is realized to control the inverter circuit (16, 56, 86), based on the phase position of the voltage signal ($U_E$), such that a control voltage ($U_s$) with a predefined voltage curve is applied at the piezo interface, wherein
the voltage curve of the control voltage ($U_s$) results from fragmenting and joining curve portions of a voltage curve of the voltage signal ($U_E$).

2. The piezo driving circuit (11, 51, 81) according to claim 1, whereby the inverter circuit (15, 56, 86) comprises a switch matrix with a plurality of lines arranged in rows, a plurality of lines arranged in columns, and a plurality of switches (S) arranged at the line intersections of the switch matrix, each of which connects a row line with a column line, whereby, to control the switches (S), the plurality of switches (S) are connected with a control signal to the sync control circuit (SK).

3. The piezo driving circuit (11, 51, 81) according to claim 1, further comprising a discharge switch (Sc) connected in parallel to the piezo interface.

4. The piezo driving circuit (11, 51, 81) according to claim 3, whereby the discharge switch (Sc) is connected in series with a resistor (Rc).

5. The piezo driving circuit (11, 51, 81) according to claim 1, further comprising an additional switch (Su) connected in series between the discharge switch (Sc) and the piezo interface (13, 53, 83) and connected in parallel to a bridging resistor (Ru).

6. The piezo driving circuit (11, 51, 81) according to claim 1, whereby the voltage signal ($U_E$) comprises an AC voltage signal or a polyphase AC voltage signals.

7. The piezo driving circuit (11, 51, 81) according to claim 1, whereby the piezo interface (13, 53, 83) is realized such that a plurality of piezo actuators (Pz) may be switched in parallel.

8. The piezo driving circuit (11, 51, 81) according to claim 2, whereby the piezo interface comprises a plurality of connectors for a plurality of groups (GR1-GRm) of piezo actuators (Pz), whereby two column lines are allocated to each of the groups (GR1-GRm) of piezo actuators.

9. The piezo driving circuit (11, 51, 81) according to claim 8, whereby the sync control circuit (SK) is realized to generate a separate control signal for each of the groups (GR1-GRm) of piezo actuators (Pz) such that the individual groups (GR1-GRm) pf of piezo actuators are independently controllable.

10. The piezo driving circuit (11, 51, 81) according to claim 1, further comprising a voltage source connected to the input (12, 52, 82) and/or wherein an isolating transformer is connected between the voltage source and the inverter circuit (16, 56, 86).

11. A method of controlling a piezo actuator arrangement (14, 54, 84), comprising at least the steps of:
receiving a voltage signal ($U_E$),
fragmenting and joining curve portions of the voltage signal ($U_E$) by reversing the polarity of the voltage signal ($U_E$) according to a predefined switching scheme, and
applying the polarity-reversed voltage signal as a control voltage ($U_s$) at a piezo interface (13, 53, 83) for connection to terminals of a piezo actuator arrangement (14, 54, 84) with at least one voltage-controlled piezo actuator (Pz).

12. The method according to claim 11, whereby the control voltage ($U_s$) is modified by discharging the piezo actuators (Pz) through a further discharging switch (Sc) connected in parallel to the piezo interface (13, 53, 83) and/or whereby the control voltage ($U_s$) is further modified by connecting a series resistor (Ru).

13. The method according to claim 11, whereby driving of the switches (S) is temporally offset from the zero-crossing of the voltage signal($U_E$), so that the polarity of the control voltage ($U_s$) applied at the piezo interface (13, 53, 83) varies.

14. A piezo actuator configuration (10, 50, 80) comprising a piezo actuator arrangement (14, 54, 84) and a piezo driving circuit (11, 51, 81) according to claim 1.

15. A metering valve comprising a piezo actuator configuration (10, 50, 80) according to claim 14.

* * * * *